United States Patent
Akahane (10) Patent No.: US 10,374,592 B2
(45) Date of Patent: Aug. 6, 2019

(54) SEMICONDUCTOR DEVICE (71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 400 days.

(21) Appl. No.: 15/207,493

(22) Filed: Jul. 11, 2016

(65) Prior Publication Data

US 2016/0322966 A1 Nov. 3, 2016

Related U.S. Application Data (63) Continuation of application No. PCT/JP2015/064858, filed on May 25, 2015.

(30) Foreign Application Priority Data

Jul. 14, 2014 (JP) .................. 2014-143811

(51) Int. Cl.
  *H03K 17/0812* (2006.01)
  *H03K 5/08* (2006.01)
  *H03K 17/16* (2006.01)
  *H03K 17/18* (2006.01)
  *H02M 1/08* (2006.01)
  (Continued)

(52) U.S. Cl.
  CPC ... *H03K 17/08128* (2013.01); *H01L 27/0255* (2013.01); *H01L 27/0629* (2013.01); *H02M 1/08* (2013.01); *H03K 5/08* (2013.01); *H03K 17/165* (2013.01); *H03K 17/18* (2013.01);
  (Continued)

(58) Field of Classification Search
  CPC ............ H03K 17/0826; H03K 17/667; H03K 17/00–17/98
  See application file for complete search history.

(56) References Cited

U.S. PATENT DOCUMENTS 5,365,118 A * 11/1994 Wilcox .................. H02M 1/38
  327/109
6,597,550 B1   7/2003 Chey et al.
  (Continued)

FOREIGN PATENT DOCUMENTS

JP   2001-210792 A   8/2001
JP   2004-349296 A   12/2004
  (Continued)

*Primary Examiner* — Ronald W Leja
*Assistant Examiner* — Christopher J Clark
(74) *Attorney, Agent, or Firm* — Rabin & Berdo, P.C.

(57) ABSTRACT

A semiconductor device includes a first circuit operating with a first potential as a reference potential and a second circuit operating with a second potential different from the first potential as a reference potential, able to reliably detect that a negative voltage is applied to the first circuit. The first circuit includes a current source. The current source supplies a current to the low side circuit, and changes the current in response to whether or not the first potential becomes a negative voltage with respect to the second potential. Also, the second circuit includes a negative voltage detection circuit. The negative voltage detection circuit monitors a change in the current supplied from the current source and detects that a negative voltage is applied to the high side circuit.

19 Claims, 8 Drawing Sheets

(51) Int. Cl.
  *H01L 27/02* (2006.01)
  *H01L 27/06* (2006.01)
  *H03K 19/0175* (2006.01)
  *H01L 29/866* (2006.01)

(52) U.S. Cl.
  CPC .... *H03K 19/017509* (2013.01); *H01L 29/866* (2013.01); *H03K 2217/0027* (2013.01)

(56) References Cited

U.S. PATENT DOCUMENTS

| | | | | |
|---|---|---|---|---|
| 7,466,170 | B2* | 12/2008 | Balakrishnan | H02M 3/33592 327/112 |
| 8,284,533 | B2* | 10/2012 | Hano | H02M 1/08 361/90 |
| 9,209,793 | B2* | 12/2015 | Lee | H03K 17/06 |
| 2004/0120090 | A1* | 6/2004 | Galli | H02M 1/32 361/115 |
| 2004/0232522 | A1 | 11/2004 | Shimizu | |
| 2008/0030257 | A1* | 2/2008 | Jasberg | H03K 17/082 327/434 |
| 2008/0238520 | A1* | 10/2008 | de Rooij | H03K 17/0414 327/310 |
| 2009/0160534 | A1* | 6/2009 | Jansen | H02M 7/538 327/536 |
| 2009/0256617 | A1* | 10/2009 | Ochi | H03F 3/2173 327/333 |
| 2010/0283116 | A1 | 11/2010 | Shimizu | |
| 2014/0118874 | A1* | 5/2014 | Kandah | H03K 17/0826 361/93.1 |
| 2014/0233278 | A1* | 8/2014 | Li | H02M 7/53873 363/37 |
| 2015/0074493 | A1* | 3/2015 | Kajigaya | G06F 11/1048 714/764 |
| 2015/0108936 | A1* | 4/2015 | Sicard | H03K 17/063 318/504 |

FOREIGN PATENT DOCUMENTS

| | | | |
|---|---|---|---|
| JP | 2009-060226 A | 3/2009 | |
| JP | 2010-263116 A | 11/2010 | |
| JP | WO 2016009719 A1 * | 1/2016 | ............... H03K 5/08 |

\* cited by examiner

SEMICONDUCTOR DEVICE

TECHNICAL FIELD

The present invention relates to a semiconductor device which includes, for example, a high side circuit and low side circuit which control a complementary on/off drive of first and second semiconductor switching elements forming a half bridge circuit, and in particular which can reliably detect a negative voltage which is applied to the high side circuit when the first semiconductor switching element operates off.

BACKGROUND ART

As a power supply which drives an industrial motor or server, one which includes first and second semiconductor switching elements connected in series to form a half bridge circuit, and which supplies power to a load, such as the motor, from the midpoint of the half bridge circuit, is known. The first and second semiconductor switching elements of this kind of power supply are each formed of, for example, an IGBT or a high voltage power MOS-FET. In particular, the first semiconductor switching element on the high potential side is driven on/off with a first voltage, which is a midpoint potential of the half bridge circuit, as a reference potential. Also, the second semiconductor switching element is driven on/off with a second voltage lower than the first voltage, specifically, a ground potential as a reference potential. Further, complementarily driven on/off, the first and second semiconductor switching elements switch a predetermined voltage applied to the half bridge circuit and supply the power to the load.

Herein, the complementary on/off drive of the first and second semiconductor switching elements is carried out, in general, using a semiconductor device forming a high voltage compatible integrated circuit which is referred to as a so-called HVIC (High Voltage Integrated Circuit). This kind of semiconductor device includes, for example, a first circuit, which operates with the first voltage as the reference potential, as the high side circuit, and a second circuit, which operates with the second voltage different from the first voltage as the reference potential, as the low side circuit. Specifically, the first circuit configures a first driver which drives on/off the first semiconductor switching element. Also, the second circuit configures a second driver which drives on/off the second semiconductor switching element.

The semiconductor device, upon receiving in the low side circuit a low potential control signal given from a controller, such as a microcomputer, which dominates the control of the whole of a system, transmits the control signal to the first and second drivers, thereby controlling the operation of the semiconductor device. Specifically, the semiconductor device drives the second driver in accordance with the control signal, and drives the first driver by level shifting the control signal, specifically, stepping up the control signal to a high potential, and transmitting the high potential control signal to the high side circuit.

Meanwhile, the semiconductor device includes in each of the high side circuit and low side circuit an anomaly detection circuit which detects abnormal heat generation, overcurrent, or the like of the first and second semiconductor switching elements. The semiconductor device level shifts an anomaly signal, such as abnormal heat generation or overcurrent, which is detected in the high side circuit, specifically, steps down the anomaly signal to a low potential, and transmits the low potential anomaly signal to the low side circuit. Further, a control circuit provided in the low side circuit stop controls the operation of the semiconductor device by stopping the transmission of the control signal to the first and second drivers when an anomaly signal, such as the abnormal heat generation or overcurrent, is detected. Also, an alarm output circuit provided in the low side circuit outputs an alarm signal when an anomaly, such as the abnormal heat generation or overcurrent, is detected, and notifies the controller, such as a microcomputer. The controller, when receiving the alarm signal, changes the control of the semiconductor device or stops the drive of the semiconductor device and thereby protects the whole of the system.

In the meantime, when the first semiconductor switching element on the high potential side of the half bridge circuit operates off, it sometimes happens that a negative voltage surge is applied to the semiconductor device due to inductance included in a load such as the motor. The negative voltage surge is the phenomenon that the reference potential of the half bridge circuit defined by the midpoint potential of the half bridge circuit instantaneously becomes lower than the ground potential which is the reference potential of the low side circuit. Then, a large current flows into the semiconductor device from a ground potential terminal due to the negative voltage surge, and there is fear that the semiconductor device breaks down due to the large current.

In order to prevent this kind of breakdown of the semiconductor device due to the negative voltage surge, it is disclosed in, for example, PTL 1 that a diode is provided in inverse parallel between a midpoint potential terminal which defines the first voltage in the semiconductor device and the ground potential terminal which sets the second voltage, and that the potential of the negative voltage surge is clamped by the diode. Also, it is disclosed in PTL 2 to improve the structure of a device itself configuring the semiconductor device, thereby enhancing the surge breakdown voltage of the semiconductor device and protecting the semiconductor device. Furthermore, it is disclosed in PTL 3 that the current flowing into the semiconductor device from the ground potential terminal is suppressed by a resistance element, thereby limiting the current when the negative voltage surge occurs and protecting the semiconductor device.

CITATION LIST

Patent Literature

PTL 1: JP-A-2010-263116
PTL 2: JP-A-2004-349296
PTL 3: JP-A-2001-210792

SUMMARY OF INVENTION

Technical Problem

However, the heretofore described technique disclosed in each PTL 1, 2, and 3 is a technology which merely alleviates the effects of the negative voltage surge on the semiconductor device and thereby protects the semiconductor device. That is, each of the techniques is not the technology of detecting the occurrence itself of the negative voltage surge applied to the semiconductor device. Therefore, it is not possible, even by adopting these techniques, to reliably protect the semiconductor device and the whole of the system including the first and second semiconductor switching elements and furthermore the load when the negative voltage surge occurs.

Incidentally, by it being possible to quickly detect the occurrence of the negative voltage surge applied to the semiconductor device in addition to the previously described abnormal heat generation or overcurrent in the first and second semiconductor switching elements, it is possible to notify the controller of the alarm signal before the semiconductor device breaks down due to the negative voltage surge. Further, by changing the control of the semiconductor device under the controller, or stopping the drive of the semiconductor device, or furthermore, by changing the operation mode of the system, it is possible to effectively protect the whole of the system even when the negative voltage surge occurs.

The invention, having been contrived bearing in mind this kind of situation, has for its object to provide a semiconductor device which can quickly detect an occurrence of a negative voltage surge applied to a high side circuit and can prevent, for example, thermal breakdown due to the negative voltage surge.

Solution to Problem

In order to achieve the heretofore described object, a semiconductor device according to the invention includes a first circuit which operates with a first voltage as a reference potential and a second circuit which operates with a second voltage different from the first voltage as a reference voltage. In particular, the semiconductor device according to the invention is characterized in that a current source which changes a current to be supplied to the second circuit, in response to whether or not the first voltage becomes a negative voltage with respect to the second voltage, is provided in the first circuit, and that a negative voltage detection circuit, which monitors a change in the current supplied from the current source and detects that the negative voltage is applied to the first circuit, is provided in the second circuit.

Incidentally, the current source is configured so as to supply a predetermined current toward the second circuit when the first voltage is higher than the second voltage, and reverse the direction of the current to be supplied to the second circuit when the first voltage is lower than the second voltage. Also, the negative voltage detection circuit is configured so as, when the direction of the current supplied from the current source changes, to detect the change as the negative voltage being applied to the first circuit.

Specifically, the first circuit is a high side circuit which controls an on/off operation of a semiconductor switching element with a higher voltage than a ground potential received at one terminal, while the second circuit is a low side circuit which operates with the ground potential as a reference potential.

Preferably, the first circuit includes a first driver which controls the operation of the semiconductor switching element which operates on/off with the intermediate potential as a reference. For example, the first circuit is formed of one which turns on/off a current flowing through a inductor via a semiconductor switching element and controls an on/off operation of the semiconductor switching element in a converter which generates power to be supplied to a load via the inductor.

Alternatively, the first and second circuits are integrated into a high voltage compatible integrated circuit which complementarily controls an on/off drive of first and second semiconductor switching elements which are connected in series to form a half bridge circuit and configure a power source portion which supplies the power to the load from the midpoint of the half bridge circuit.

In this case, for example, the first circuit is formed of a high side circuit including a first driver which drives the first semiconductor switching element which operates on/off with the intermediate potential, which is the potential of the midpoint of the half bridge circuit, as a reference. Also, the second circuit is formed of a low side circuit including a second driver which drives the second semiconductor switching element which operates on/off with the ground potential as a reference.

The first driver in the high side circuit may be built in as one portion of the first circuit, and the second driver in the low side circuit may also be built in as one portion of the second circuit.

Herein, the current source is configured mainly of, for example, a high voltage MOS-FET, the source of which is connected to a predetermined voltage power source, and which operates upon receiving a predetermined bias voltage at the gate and outputs a constant current from the drain. Also, the negative voltage detection circuit is realized as including, for example, a current-voltage conversion circuit which converts the current supplied from the current source to a voltage and a comparator which compares the output voltage of the current-voltage conversion circuit with a predetermined reference voltage and detects a negative voltage applied to the first circuit.

Specifically, the current-voltage conversion circuit is configured to include, for example, a resistance element which converts the current supplied from the current source to a voltage and a clamp circuit which is connected in parallel to the resistance element and clamps a voltage applied to the resistance element. Alternatively, the current-voltage conversion circuit is configured to include, for example, a current mirror circuit which generates a current proportional to the current supplied from the current source, a resistance element which converts a current output from the current mirror circuit to a voltage, and a clamp circuit which is connected in parallel to the current mirror circuit and clamps a voltage applied to the current mirror circuit.

Herein, the clamp circuit is formed of a Zener diode. Alternatively, the clamp circuit is configured to include a plurality of Zener diodes connected in series and a diode connected in inverse parallel to a series circuit of the Zener diodes.

Preferably, the negative voltage detection circuit is configured so as, when detecting a negative voltage applied to the first circuit, to output a stop signal which stops the drive of a semiconductor switching element which is controlled on/off by the first circuit. Further, the second circuit is configured to include, for example, an alarm output circuit which, when a signal is output from the negative voltage detection circuit for a predetermined time, outputs to the external an alarm signal indicating an anomaly of a semiconductor switching element whose drive is controlled by the first circuit.

Advantageous Effects of Invention

According to the semiconductor device of the heretofore described configuration, when in a state in which a positive voltage is applied to the first circuit (high side circuit), a current source provided in the high side circuit supplies a current toward the second circuit (low side circuit). Also, when a negative voltage is applied to the high side circuit, a current in the opposite direction flows toward the current source from the low side circuit. As a result of this, the negative voltage detection circuit provided in the low side circuit can quickly and reliably detect, from a change in the direction of the current, a state in which the negative voltage is applied to the high side circuit. Specifically, as the current-voltage conversion circuit outputs a voltage corresponding to the direction of the current, by detecting the output voltage of the current-voltage conversion circuit with a comparator, it is possible to quickly and simply detect the state in which the negative voltage is applied to the high side circuit.

Incidentally, it is possible to relatively easily realize the current source by utilizing the same type of high voltage p-type MOS-FET as the one used in a level shift circuit which is provided in the high side circuit and which level converts a signal of the high side circuit and supplies the signal to the low side circuit. For example, the current source is configured so that a gate voltage which comes into an on-state in a normal state in which no negative voltage surge occurs is applied to the p-type MOS-FET. Then, the current source can supply a micro-current toward the low side circuit from the high side circuit in the state in which the positive voltage is applied to the high side circuit.

Also, the current-voltage conversion circuit can be realized as being of a relatively simple configuration by using a resistance element which converts the current supplied from the current source to a voltage and a clamp circuit formed of a Zener diode which is connected in parallel to the resistance element and clamps a voltage applied to the resistance element. At this time, by a voltage defined by the current value of the current source and the resistance value of the resistance element being set so as to be equal to or more than the clamp voltage of the Zener diode, it is possible to make the voltage converted by the resistance element constant at the clamp voltage.

Also, when the negative voltage is applied to the high side circuit, a current in the opposite direction flows from the low side circuit toward the p-type MOS-FET configuring the current source. At this time, the Zener diode is forward biased to a low impedance, and the cathode voltage of the Zener diode becomes a negative voltage. Consequently, it becomes possible, owing to the resistance element and the Zener diode, to simply and reliably detect the state in which the negative voltage is applied to the high side circuit.

Consequently, according to the semiconductor device of the heretofore described configuration, it is possible to quickly, simply, and reliably detect the state in which the negative voltage is applied to the high side circuit. Therefore, it becomes possible to effectively protect the whole of the system by, for example, detecting the state in which the negative voltage is applied to the high side circuit and stopping the drive of the high side circuit, or furthermore outputting an alarm signal, before the semiconductor device breaks down due to a negative voltage surge.

DESCRIPTION OF EMBODIMENTS

Hereafter, a description will be given, referring to the drawings, of a semiconductor device according to an embodiment of the invention.

Figure 1:
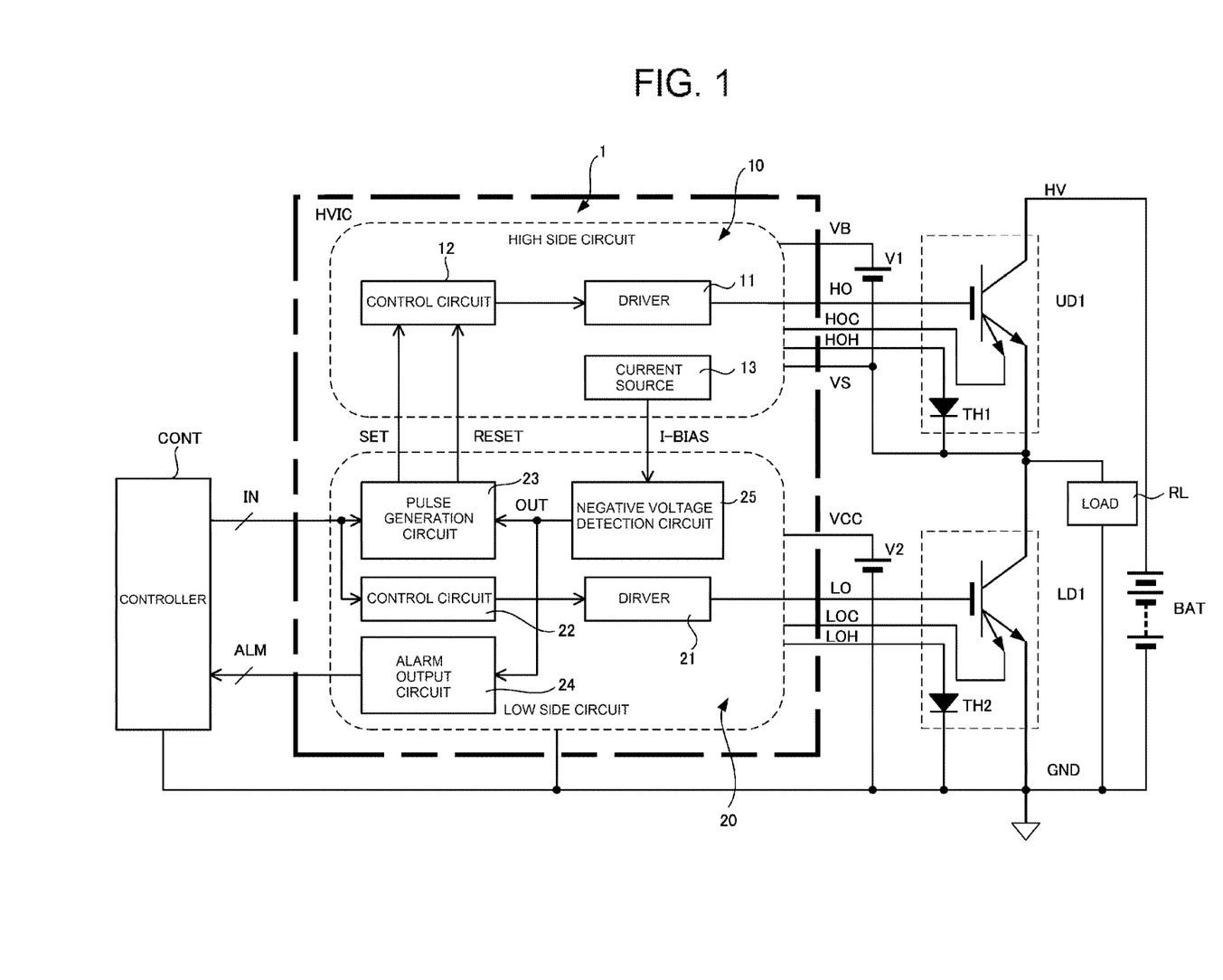
FIG. 1 is a diagram showing a main portion outline configuration, and a peripheral circuit, of a semiconductor device according to an embodiment of the invention.

FIG. 1 is a diagram showing a semiconductor device according to an embodiment of the invention and a peripheral circuit thereof. The semiconductor device according to the embodiment is realized as a high voltage integrated circuit HVIC which complementarily controls an on/off drive of first and second semiconductor switching elements UD1 and LD1 which are connected in series to configure a half bridge circuit.

Herein, the first and second semiconductor switching elements UD1 and LD1 are each formed of, for example, an IGBT which includes a current sensing emitter. The first and second semiconductor switching elements UD1 and LD1 are complementarily driven on/off upon receiving, at their respective gates, drive signals HO and LO output by a semiconductor device 1 according to the invention which is realized as the high voltage integrated circuit HVIC. Further, the first and second semiconductor switching elements UD1 and LD1 switch a predetermined voltage HV supplied from a direct current power source BAT, and thereby supply predetermined power to a load RL, such as a motor, from the midpoint of the half bridge circuit.

Incidentally, the first semiconductor switching element UD1 operates to switch with a first potential VS, which is a midpoint potential (intermediate potential) of the half bridge circuit, as a reference potential. Also, the second semiconductor switching element LD1 operates to switch with a second potential GND, which is defined as a ground potential, as a reference potential. Consequently, the drive signal HO which drives on/off the first semiconductor switching element UD1 is output from the semiconductor device 1 as a pulse signal with the first potential VS as a reference. Also, the drive signal LO which drives on/off the second semiconductor switching element LD1 is output from the semiconductor device 1 as a pulse signal with the second potential GND as a reference.

In the meantime, the semiconductor device 1 which complementarily controls the on/off drive of the first and second semiconductor switching elements UD1 and LD1, as heretofore described, includes, in this example, a first driver 11 which outputs the drive signal HO and a second driver 21 which outputs the drive signal LO. The first driver 11 is provided in a high side circuit 10 which operates with the first potential VS as the reference potential in the semiconductor device 1. Also, the second driver 21 is provided in a low side circuit 20 which operates with the second potential GND as the reference potential in the semiconductor device 1.

Herein, the high side circuit 10 is formed in a high side region for high voltage circuit which is set in the semiconductor device 1. Further, the high side circuit 10 operates, upon receiving a predetermined power source voltage VB applied from a direct current power source V1, with the first potential VS, which is fixed as the midpoint potential of the half bridge circuit, as the reference potential. Also, the low side circuit 20 is formed in a low side region for low voltage circuit which is set in the semiconductor device 1. Further, the low side circuit 20 operates upon receiving a predetermined power source voltage VCC applied from a direct current power source V2 with the second potential GND, which is fixed as the ground potential, as the reference potential.

The semiconductor device 1 which includes the first driver 11 in the high side circuit 10 and the second driver 21 in the low side circuit 20 in this way operates basically upon receiving in the low side circuit 20 a low potential control signal IN given from a controller CONT such as a microcomputer. Specifically, the semiconductor device 1 level shifts the control signal IN to a high potential signal and transmits the signal to a first control circuit 12 provided in the high side circuit 10. Also, the semiconductor device 1 transmits the control signal IN to a second control circuit 22 provided in the low side circuit 20. Further, the semiconductor device 1 generates the drive signals HO and LO respectively by driving the first and second drivers 11 and 21 under the first and second control circuits 12 and 22. The first and second semiconductor switching elements UD1 and LD1 are complementarily driven on/off by the drive signals HO and LO generated by the semiconductor device 1 in this way.

Herein, the level shift of the control signal IN to the high potential signal is executed by a pulse generation circuit 23 provided in the low side circuit 20. The pulse generation circuit 23, for example, generates a pulsed high voltage set signal SET by detecting a rise of the control signal IN, and generates a pulsed high voltage reset signal RESET by detecting a decay of the control signal IN. The pulse generation circuit 23 assumes the role of level shifting and transmitting the control signal IN to the first control circuit 12 by applying the set signal SET and reset signal RESET to the high side circuit 10 side.

The semiconductor device 1 includes, for example, a function to detect abnormal heat generations and overcurrents of the first and second semiconductor switching elements UD1 and LD1 as operating anomalies respectively in the high side circuit 10 and low side circuit 20, although not particularly shown in the drawing. Incidentally, abnormal heat generations HOH and LOH of the first and second semiconductor switching elements UD1 and LD1 are respectively detected using, for example, temperature sensors TH1 and TH2, such as thermistors or temperature sensing diodes, which are built into the first and second semiconductor switching elements UD1 and LD1. Also, overcurrents HOC and LOC of the first and second semiconductor switching elements UD1 and LD1 are respectively detected from, for example, sensing currents detected via current sensing emitters included one in each of the first and second semiconductor switching elements UD1 and LD1.

Further, an anomaly signal indicating the abnormal heat generation or overcurrent of the first semiconductor switching element UD1 detected in the high side circuit 10 is stepped down to a low potential via a not-shown level shift circuit provided in the high side circuit 10 and transmitted to the low side circuit 20. The anomaly signal indicating the operating anomaly of the first semiconductor switching element UD1 transmitted to the low side circuit 20 in this way is given to the pulse generation circuit 23 together with an anomaly signal indicating the abnormal heat generation or overcurrent of the second semiconductor switching element LD1 detected in the low side circuit 20.

Herein, the pulse generation circuit 23 includes the role of level shifting and transmitting the control signal IN to the high side circuit 10, as heretofore described, and includes a function to stop the transmission of the control signal IN to the high side circuit 10 when the anomaly signal is input. In some cases, the stop of transmission of the control signal IN is carried out after an instruction for an off operation of the first semiconductor switching element UD1 is issued first.

Also, the anomaly signal is also given to an alarm output circuit 24 provided in the low side circuit 20. The alarm output circuit 24 assumes the role of, for example, when the input of the anomaly signal continues for a predetermined time, taking this occurrence as an anomaly of a system and outputting an alarm signal ALM to the controller CONT. The controller CONT into which is input the alarm signal stops the drive of the semiconductor device 1 and/or stops the system by, for example, (a) stopping to output the control signal IN, (b) turning off both the first and second semiconductor switching elements UD1 and LD1, (c) disconnecting the load, or (d) disconnecting the direct current power source V1. Damage to the semiconductor device 1 and to the whole of the system including the first and second semiconductor switching elements UD1 and LD1 and furthermore the load RL is prevented by stopping the drive of the semiconductor device 1 and/or stopping the system.

In the meantime, the feature of the invention in the semiconductor device 1 configured in the heretofore described way is basically that a current source 13 is provided in the high side circuit 10 and that a negative voltage detection circuit 25 is provided in the low side circuit 20. The current source 13 assumes the role of supplying a micro-current I-BIAS toward the low side circuit 20. Also, the negative voltage detection circuit 25 assumes the role of monitoring the direction of the current I-BIAS supplied from the current source 13 and detecting a negative voltage applied to the high side circuit 10.

Figure 2:
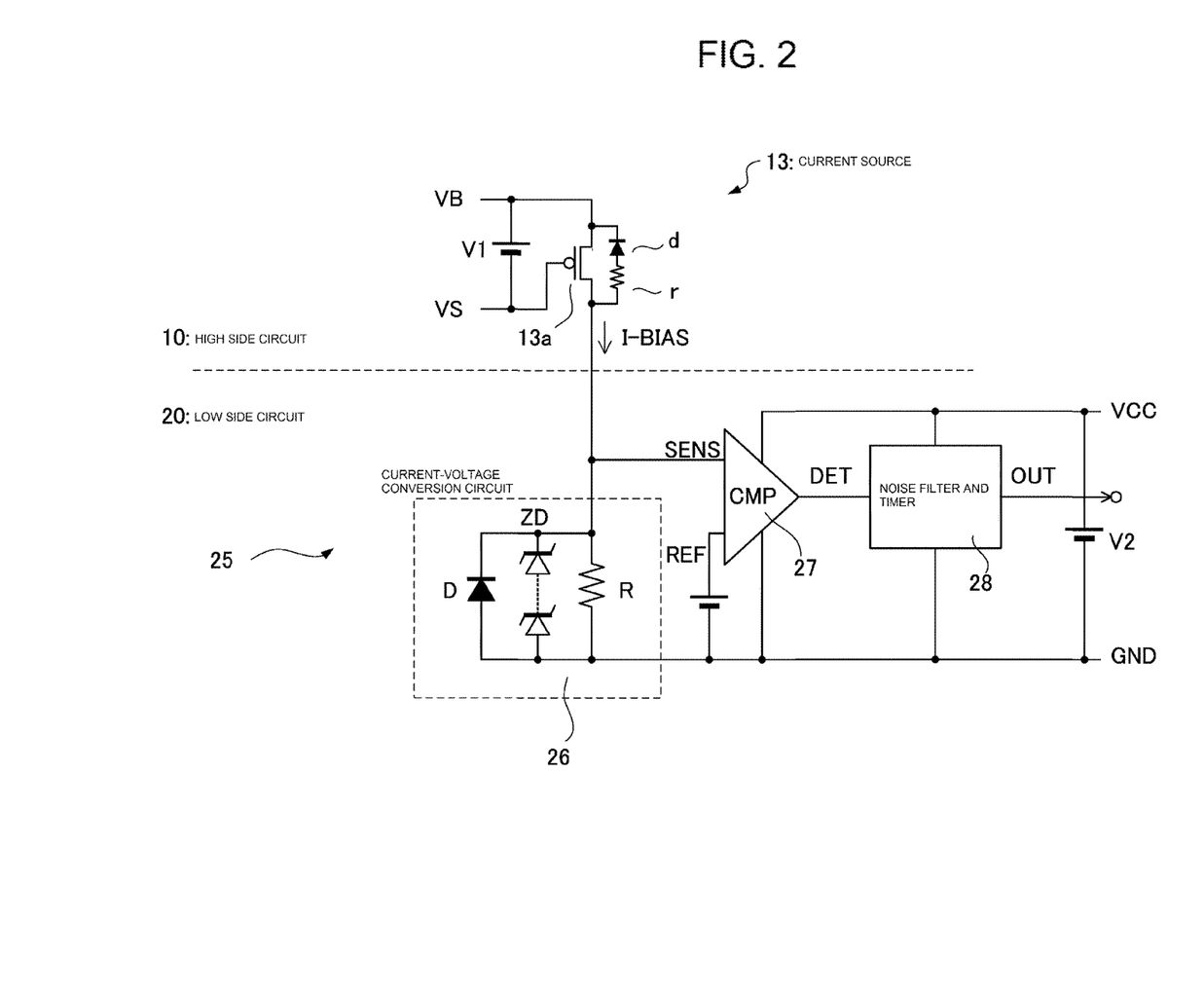
FIG. 2 is a diagram showing configuration examples of a current source provided in a high side circuit and of a negative voltage detection circuit provided in a low side circuit.

As in, for example, the configuration examples of the current source 13 and negative voltage detection circuit 25 shown in FIG. 2, the current source 13 is constructed by utilizing the same type of high voltage p-type MOS-FET as one which is provided in the high side circuit 10 and configures a not-shown level shift circuit or the like. Specifically, the current source 13 is realized as a high voltage p-type MOS-FET 13a, the source of which is connected to the positive electrode of the direct current power source V1 and into the gate of which the first potential VS is input. In FIG. 2, d denotes a parasitic diode of the p-type MOS-FET 13a, and r denotes a parasitic resistance of the p-type MOS-FET 13a.

Incidentally, the p-type MOS-FET 13a has the same element structure as the p-type MOS-FET configuring the level shift circuit in the high side circuit 10, and is formed in the high side region of the semiconductor device 1 in the same way as the p-type MOS-FET of the level shift circuit. However, the channel width and/or channel length of the p-type MOS-FET 13a is different from that of the other p-type MOS-FET of the level shift circuit.

The current source 13 configured using the p-type MOS-FET 13a in this way operates with the first potential VS as a reference potential. Further, the current source 13, upon receiving the power source voltage VB, outputs the constant micro-current I-BIAS toward the low side circuit 20. The current I-BIAS is a saturation current of the p-type MOS- FET 13a corresponding to a gate-source voltage [VB-VS] equal to the voltage across the direct current power source V1.

Herein, the current source 13 provided in the high side circuit 10 acts in the following way. In a steady state in which the first semiconductor switching element UD1 is turned on and the second semiconductor switching element LD1 is turned off, for example, the power source voltage VB of 100V and the first potential VS of 85V are given to the high side circuit 10. That is, in the high side circuit 10, a positive voltage of 15V is applied by the direct current power source V1. As a result of this, the p-type MOS-FET 13a configuring the current source 13, whose terminal side to which the power source voltage VB is applied serves as the source, outputs the current I-BIAS toward the low side circuit 20, as previously described.

As opposed to this, when a negative voltage surge occurs as a result of an off operation of the first semiconductor switching element UD1, for example, the first potential VS changes to −30V, while the power source voltage VB changes to −15V. Then, as the second potential GND defined as 0V becomes higher than the power source voltage VB of −15V, the p-type MOS-FET 13a configuring the current source 13 is such that the terminal on the side opposite the terminal side to which the power source voltage VB is applied serves as the source. As a result of this, a current in the opposite direction to that in the heretofore described steady state flows through the p-type MOS-FET 13a.

When the negative voltage surge occurs, the gate-source voltage of the p-type MOS-FET 13a becomes larger than when in the heretofore described steady state. Therefore, a large current flows instantaneously through the p-type MOS-FET 13a. However, as the time for which the negative voltage surge occurs is very short, the heretofore described instantaneous large current hardly affects the p-type MOS-FET 13a. Also, a negative voltage applied to the p-type MOS-FET 13a at this time is received by the parasitic resistance r of the p-type MOS-FET 13a.

Meanwhile, the negative voltage detection circuit 25 provided in the low side circuit 20 is configured to include a current-voltage conversion circuit 26 which converts the current I-BIAS supplied from the current source 13 to a voltage and a comparator 27 which compares a voltage SENS converted by the current-voltage conversion circuit 26 with a preset reference voltage REF. The current-voltage conversion circuit 26 is configured of, for example, a resistance element R which converts the current I-BIAS supplied from the current source to a voltage and a clamp circuit which is connected in parallel to the resistance element R and clamps a positive voltage generated in the resistance element R to a predetermined voltage. The clamp circuit is formed of, for example, one or a plurality of Zener diodes ZD connected in series.

When the clamp circuit is configured of the plurality of Zener diodes ZD connected in series, the plurality of Zener diodes ZD are each forward biased when the negative voltage is applied. Therefore, when the negative voltage is applied, a forward drop voltage corresponding to the number of Zener diodes ZD connected in series which configure the clamp circuit is generated as a negative voltage. A diode D connected in parallel to the resistance element R assumes the role of clamping this kind of negative voltage to a constant voltage.

Specifically, for example, as the forward drop voltage of one Zener diode ZD is 0.7V, in a clamp circuit wherein n Zener diodes are connected in series, a negative voltage whose absolute value is [0.7V×n] is generated when the previously described negative voltage surge occurs. Then, there arises the risk that the low side circuit 20 latches up due to this large negative voltage. The diode D assumes the role of preventing the latch-up of the low side circuit 20 by clamping this kind of large negative voltage.

When the clamp circuit is configured of one Zener diode ZD, the forward drop voltage of the Zener diode ZD forward biased when the negative voltage is applied is equal to the forward drop voltage of a pn junction diode D. Consequently, when the clamp circuit is configured of one Zener diode ZD, the negative voltage applied to the low side circuit 20 when the negative voltage surge occurs is suppressed to −0.7V. Consequently, in this case, as the low side circuit 20 does not latch up, it is not always necessary to provide the diode D.

According to the current-voltage conversion circuit 26 configured in this way, in a steady state in which no negative voltage is applied to the high side circuit 10, the current I-BIAS is supplied to the current-voltage conversion circuit 26 from the current source 13, meaning that a positive voltage is generated in the resistance element R. Further, the positive voltage generated in the resistance element R is clamped to a constant voltage by the clamp circuit. Consequently, the current-voltage conversion circuit 26 outputs a positive voltage SENS corresponding to the direction in which the current I-BIAS flows.

As opposed to this, when the first semiconductor switching element UD1 turns off and the negative voltage surge is applied to the semiconductor device 1 due to the reactance component of the load RL, it sometimes happens that the first potential VS becomes lower than the second potential GND due to the negative voltage surge. Then, the voltage applied between the source and drain of the p-type MOS-FET 13a is reversed, and a current flows through the p-type MOS-FET 13a in the opposite direction to that when the first semiconductor switching element UD1 is turned on. That is, when the negative voltage surge is applied to the semiconductor device 1, a current flows, in the opposite direction, from the low side circuit 20 to the high side circuit 10. The current in the opposite direction forward biases the Zener diode ZD. As a result of this, the Zener diode ZD attains a low impedance, and a negative voltage corresponding to the negative voltage surge is generated in the resistance element R.

Figure 3:
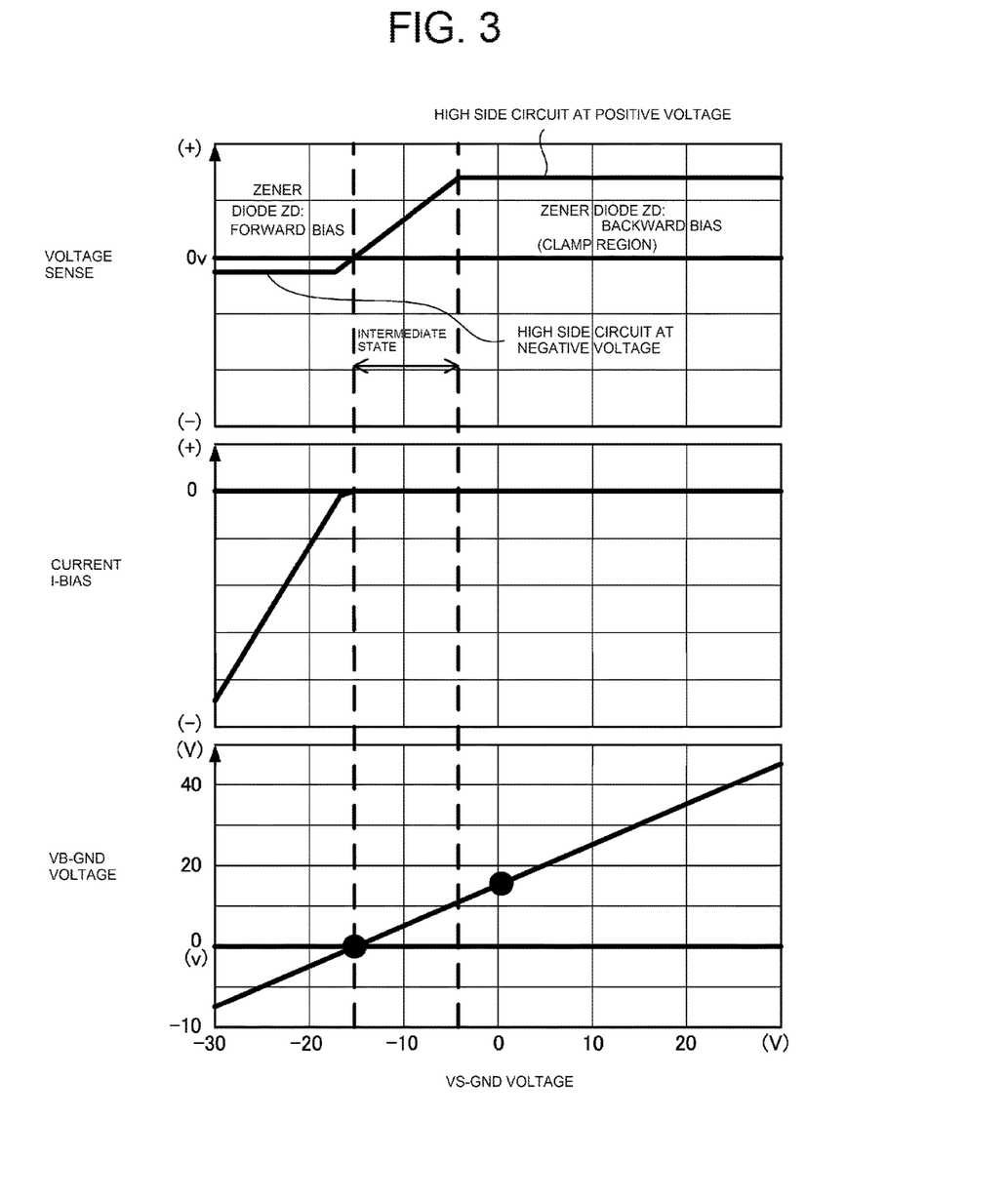
FIG. 3 is a chart for illustrating an operation of the negative voltage detection circuit.

FIG. 3 shows operating characteristics of the current-voltage conversion circuit 26 configured in the heretofore described way. That is, FIG. 3 shows, from the top down, a change in the output voltage SENS of the current-voltage conversion circuit 26 with respect to a change in VS-GND voltage, a change in the current I-BIAS, and a change in VB-GND voltage, in the semiconductor device 1. As is clear from the operating characteristics of the negative voltage detection circuit 25 shown in FIG. 3, for example, in a state in which a positive voltage is applied to the semiconductor device 1 with the VS-GND voltage as 0V or more and the VB-GND voltage as 15V, no negative voltage surge occurs, and the high side circuit 10 is kept in a state in which the positive voltage is applied thereto. Further, the output voltage SENS of the current-voltage conversion circuit 26 which converts the micro-current I-BIAS supplied from the current source 13 to a voltage is in a state in which the Zener diode ZD is backward biased, and is kept at a constant positive clamp voltage.

As opposed to this, in a state in which the potential VB and the potential VS are both lower than the potential GND due to the negative voltage surge being applied to the semiconductor device 1, a current in the opposite direction to that when in the steady state flows through the current source 13. As a result of this, the Zener diode ZD or the pn junction diode D comes into a forward biased state, and the output voltage SENS of the current-voltage conversion circuit 26 is kept at a constant negative clamp voltage.

Consequently, the comparator 27 compares the voltage SENS obtained by the current-voltage conversion circuit 26 with the reference voltage REF, and thereby becomes able to quickly detect whether or not a negative voltage surge resulting from an off operation of the first semiconductor switching element UD1 is applied to the semiconductor device 1. Incidentally, a negative voltage detection signal DET detected by the comparator 27 is output via an output circuit 28 formed of, for example, a noise filter and timer. The output circuit 28 removes the noise component of the detection signal DET and, when the detection signal DET continues for a predetermined time, outputs a signal OUT.

Further, the signal OUT is given to the pulse generation circuit 23, and as a result, the transmission of the control signal IN to the first control circuit 12 is controlled. Also, the signal OUT is given to the alarm output circuit 24, and as a result of this, the alarm signal ALM is generated. Herein, the alarm output circuit 24 generates, in addition to an anomaly signal indicating the detection of the negative voltage, the previously described anomaly signal indicating the abnormal heat generation or overcurrent, as, for example, the alarm signal ALM whose pulse width or pulse frequency is changed in accordance with the anomaly type.

Also, the controller CONT determines the pulse width or pulse frequency of the alarm signal ALM notified of from the alarm output circuit 24 of the semiconductor device 1, and thereby identifies the anomaly type. Further, the controller CONT, for example, controls the output of the control signal IN in accordance with the identified anomaly type, or controls the connection of the load or power source BAT via a not-shown switch, and thereby protects the semiconductor device 1 and thus the whole of the system from an abnormal operation.

In the meantime, the current source 13 shown in FIG. 2 is such that the size of the current I-BIAS output by the current source 13 is set by adjusting the channel width and/or channel length of the p-type MOS-FET 13a. However, an arrangement may be such as to set the size of the current I-BIAS output by the current source 13 by adjusting the gate voltage of the p-type MOS-FET 13a configuring the current source 13. However, in this case, it goes without saying that a bias source 13b for setting the gate voltage of the p-type MOS-FET 13a is needed, as shown in FIG. 4.

Figure 4:
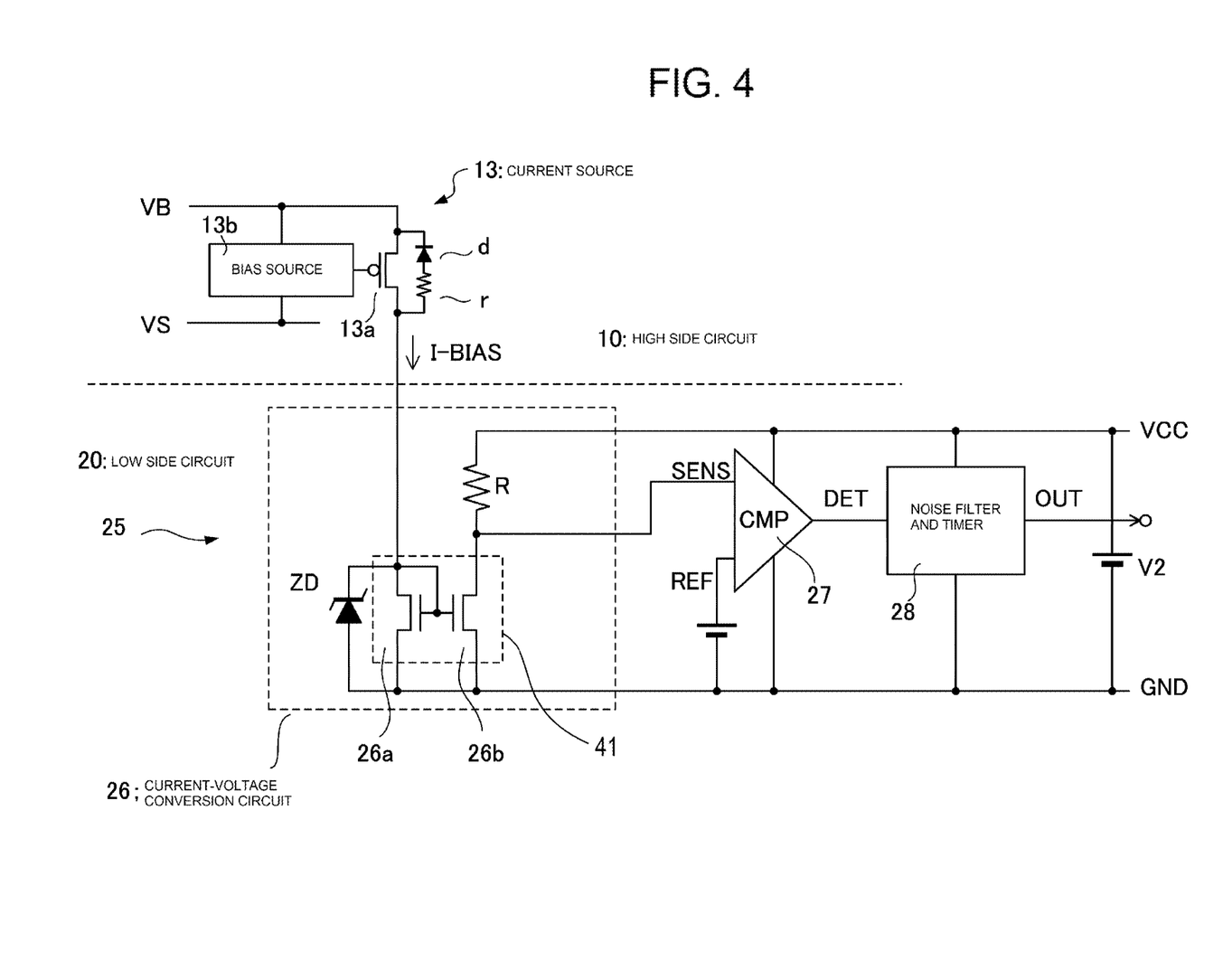
FIG. 4 is a diagram showing other configuration examples of the current source provided in the high side circuit and of the negative voltage detection circuit provided in the low side circuit.

Also, it is also possible to configure the current-voltage conversion circuit 26 using a current mirror circuit 41, as shown in FIG. 4. Specifically, the current mirror circuit 41 is configured using a pair of n-type MOS-FETs 26a and 26b, and a voltage clamping Zener diode ZD is connected in parallel to the n-type MOS-FET 26a on the current input side. Further, a voltage conversion resistance element R is connected in series between the n-type MOS-FET 26b on the current output side of the current mirror circuit 41 and the power source voltage VCC.

According to the current-voltage conversion circuit 26 configured in this way, in the steady state in which the positive voltage is applied to the semiconductor device 1, the current I-BIAS supplied from the current source 13 flows through the n-type MOS-FET 26a. Further, a current proportional to the current flowing through the n-type MOS-FET 26a flows through the resistance element R via the n-type MOS-FET 26b. As a result of this, a voltage drop corresponding to the current I-BIAS supplied from the current source 13 via the current mirror circuit 41 can be generated in the resistance element R.

Meanwhile, when the negative voltage is applied to the semiconductor device 1, a terminal, of the n-type MOS-FET 26a on the current input side of the current mirror circuit 41, on the side to which the second potential GND is applied serves as the drain, and a terminal on the high side circuit 10 side serves as the source. As a result of this, the gate and source of the n-type MOS-FET 26a become equal in potential, and the gate-source voltage becomes zero, meaning that the n-type MOS-FET 26a comes into an off-state.

Then, the n-type MOS-FET 26b on the current output side of the current mirror circuit 41 serves as a source follower, and comes into a state in which a negative voltage is applied to the gate of the n-type MOS-FET 26a. However, as the source of the n-type MOS-FET 26b to which the resistance element R is connected cannot attain a negative voltage, the n-type MOS-FET 26b also comes into an off-state. As a result of this, the output voltage SENS of the current-voltage conversion circuit 26 becomes the power source voltage VCC to be applied via the resistance element R.

Consequently, it becomes possible to detect an application of the negative voltage by comparing the output voltage SENS of the current-voltage conversion circuit 26 with the predetermined reference voltage REF, that is, by detecting whether or not the output voltage SENS becomes the power source voltage VCC, in the comparator 27. Therefore, it becomes possible to quickly and accurately detect the negative voltage surge applied to the semiconductor device 1, in the same way as in the negative voltage detection circuit 25 shown in FIG. 2. In particular, by constructing the current-voltage conversion circuit 26 using the current mirror circuit 41, as heretofore described, it is possible to set the sensitivity of detection of the current I-BIAS by merely adjusting the current mirror ratio of the current mirror circuit 41. Consequently, it is possible to easily adjust negative voltage detection sensitivity in the low side circuit 20.

Even when configuring the current-voltage conversion circuit 26 using the current mirror circuit 41, as shown in FIG. 4, it is sufficient to use one or a plurality of Zener diodes ZD connected in series as a clamp circuit which clamps the voltage applied to the n-type MOS-FET 26a to a predetermined voltage. At this time, when configuring the clamp circuit of the plurality of Zener diodes ZD connected in series, it is preferable that a diode D for clamping a negative voltage applied to the clamp circuit is connected in inverse parallel. However, when the clamp circuit is configured of only one Zener diode ZD, it is as previously described that it is not necessary to connect the diode D in parallel.

Thus, according to the semiconductor device 1 configured in the heretofore described way, it is possible to quickly and reliably detect the negative voltage applied to the semiconductor device 1 when the negative voltage surge occurs as a result of an off operation of the first semiconductor switching element UD1. Moreover, it is possible to easily detect an application of the negative voltage with a simple configuration wherein the current source 13 is provided in the high side circuit 10, while the negative voltage detection circuit 25 having the current-voltage conversion circuit 26 and comparator 27 is provided in the low side circuit 20. Further, when an application of the negative voltage is detected in the negative voltage detection circuit 25, by controlling the operation of the semiconductor device 1 or system under the controller CONT, it is possible to effectively protect not only the semiconductor device 1, but the whole of the system including the first and second semiconductor switching elements UD1 and LD1, and the like, from the negative voltage surge.

Figure 5:
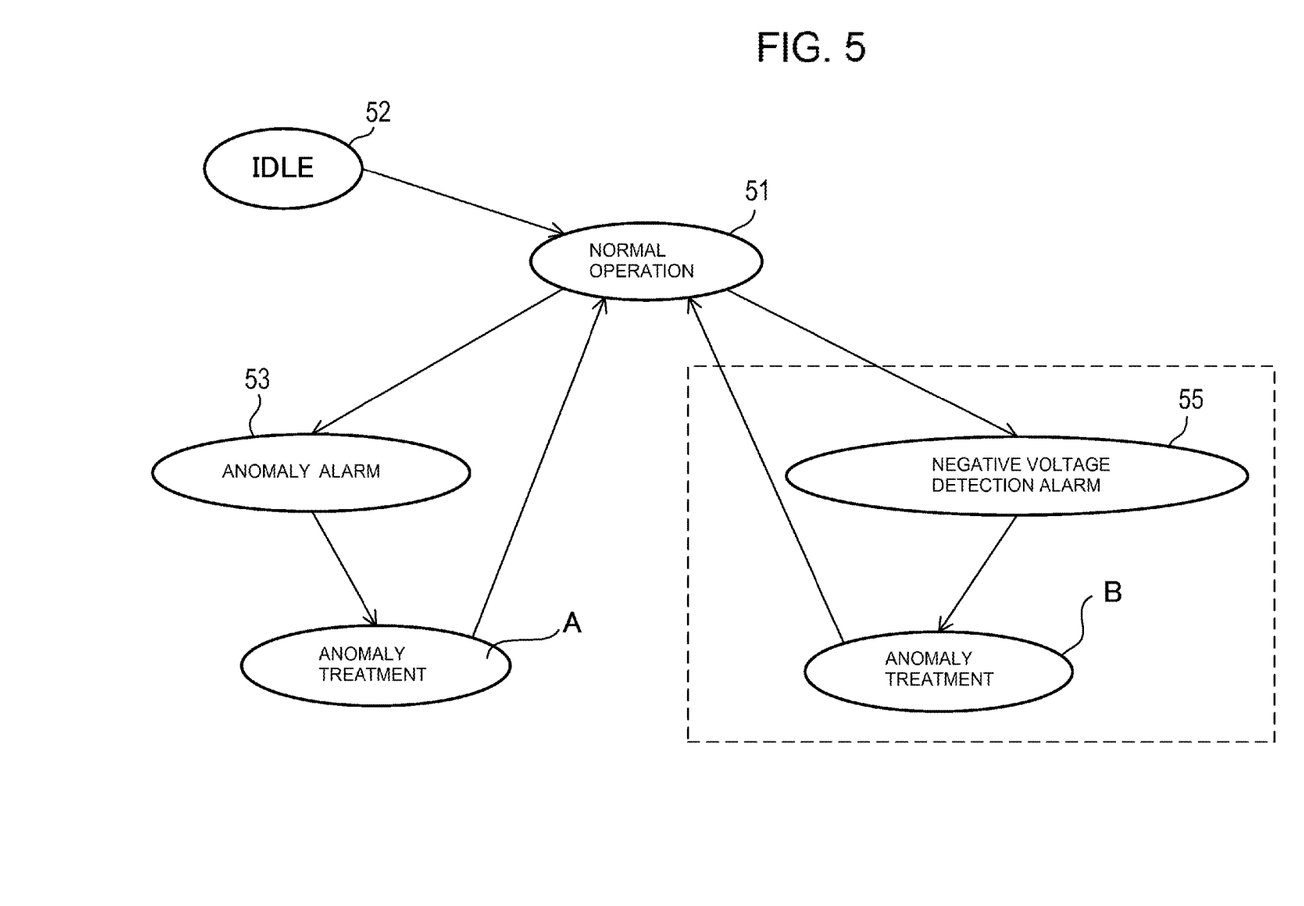
FIG. 5 is a diagram showing a state transition example of the whole of a system.

Specifically, as in the state transition of the system shown in FIG. 5, the system may have an idle state 52 and a normal operating state 51. In the normal operating state 51, when an anomaly, such as abnormal heat generation or overcurrent of the first and second semiconductor switching elements UD1 and LD1, is detected, an anomaly alarm may be generated 53, and an anomaly treatment A may be performed based on the anomaly type. In addition, in the case of the system using the semiconductor device 1 according to embodiments of the invention, it becomes possible to generate and detect a negative voltage detection alarm 55 and to execute anomaly treatment B, in addition to the heretofore described anomaly treatment A. Consequently, according to the invention, it becomes possible to ensure a stable operation of the whole of the system while preventing a malfunction and breakdown of the semiconductor device 1 due to a negative voltage surge.

In the heretofore described embodiment, a description has been given of the semiconductor device 1 including the first and second drivers 11 and 21 which complementarily drive on/off the first and second semiconductor switching elements UD1 and LD1 forming the half bridge circuit. However, the semiconductor device 1 may be constructed so as to drive on/off the first and second semiconductor switching elements UD1 and LD1 via drivers 11 and 21 which are separate circuit parts externally mounted to the semiconductor device 1, rather than the semiconductor device 1 itself including the drivers 11 and 21.

Also, the invention can be applied not only to the semiconductor device which complementarily drives on/off the first and second semiconductor switching elements UD1 and LD1 configuring the half bridge circuit. The invention can also be similarly applied to, for example, a semiconductor device which turns on/off a current flowing through a inductor L or transformer T via a semiconductor switching element S1 and controls an on/off operation of the semiconductor switching element S1 in a converter which generates the power to be supplied to a load via the inductor L or transformer T, as shown in each of FIGS. 6A-6D.

Figure 6A:
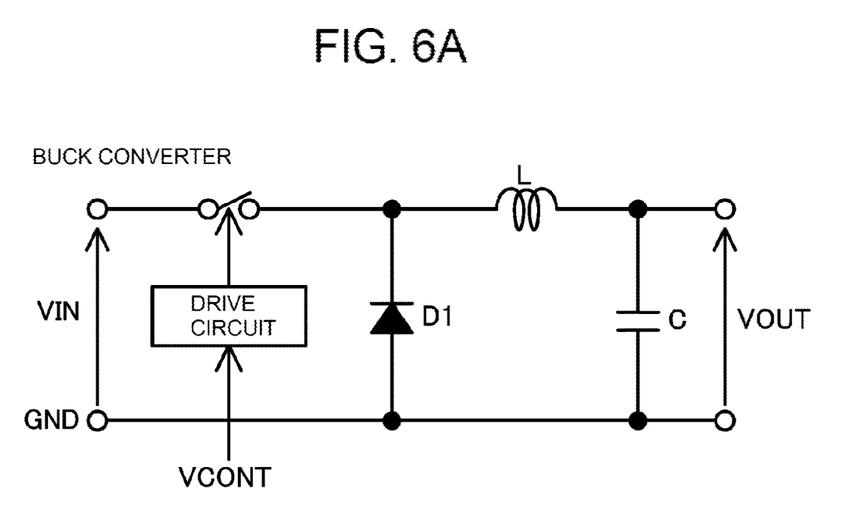
FIGS. 6A, 6B, 6C, and 6D are diagrams showing other configuration examples of a power converter whose drive is controlled by the semiconductor device according to the invention.

Incidentally, the power source circuit shown in FIG. 6A is a buck converter which includes the inductor L connected in series to the semiconductor switching element S1 and interposed on the positive line of a power source, and which is configured so as to generate the power to be supplied to the load from the inductor L via an output capacitor C by providing a diode D1 between the connection point of the inductor L and semiconductor switching element S1 and the ground potential GND.

Figure 6B:
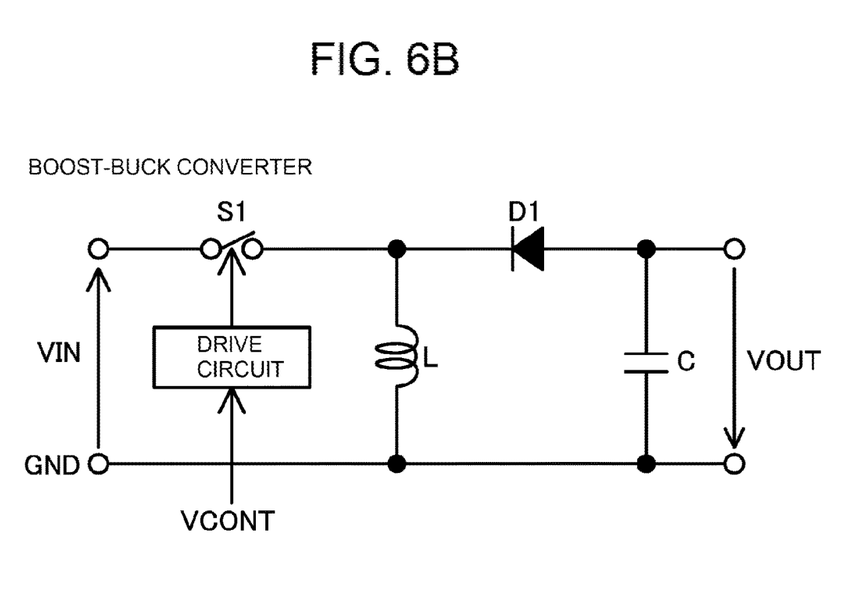

Also, the power source circuit shown in FIG. 6B is a boost-buck converter which includes the inductor L connected in series to the semiconductor switching element S1 and interposed between the positive line and ground line of a power source, and which is configured so as to generate the power to be supplied to the load via the output capacitor C from the diode D1 provided between the connection point of the inductor L and semiconductor switching element S1 and a positive output terminal. The polarity of an output voltage is reverse to those of FIGS. 6A, 6C and 6D.

As the semiconductor switching element S1 operates on/off with a midpoint voltage (an intermediate potential) which is generated at the connection point with the inductor L, as a reference potential, in each of the thus configured buck converter and boost-buck converter too, the semiconductor switching element S1 only has to be driven on/off using the semiconductor device 1 configured in the previously described way. However, in this case, as there is no low side semiconductor switching element which operates with the ground potential as a reference, it goes without saying that it is not necessary to provide the second driver 21 on the low side circuit 20 side.

Figure 6C:
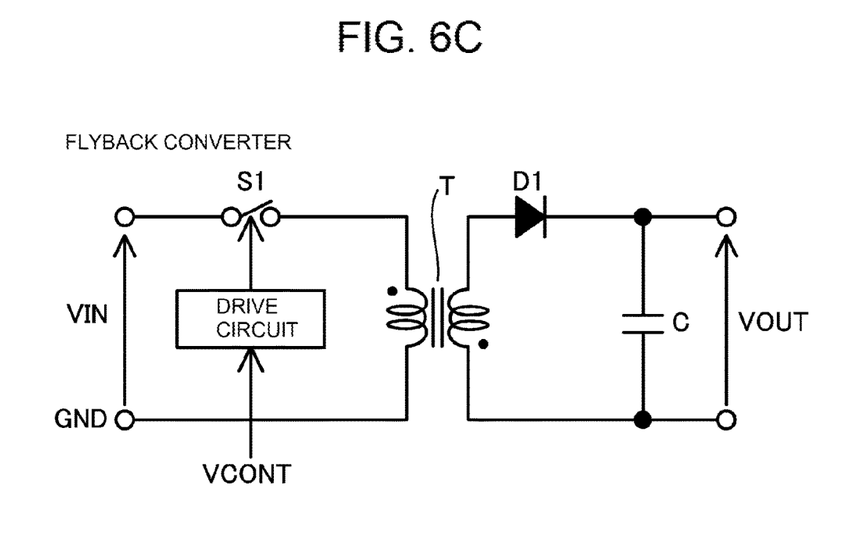
Figure 6D:
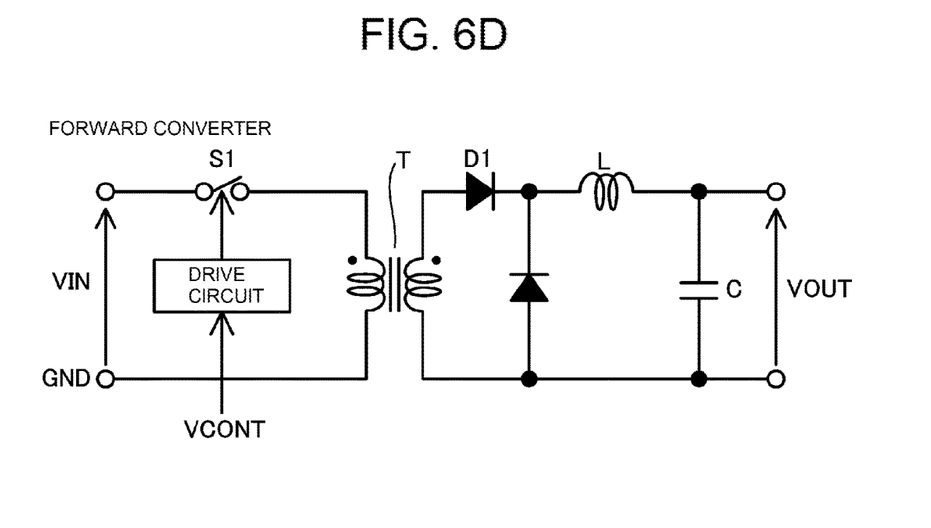

Also, the semiconductor device according to the invention can also be applied as a device which controls on/off a current flowing through a inductor, which is the primary winding of a transformer T, via the semiconductor switching element S1, as shown in each of FIGS. 6C and 6D, and which drives a flyback converter or forward converter which generates the power to be supplied to the load from a voltage generated in the secondary winding of the transformer T.

In the thus configured flyback converter or forward converter too, the semiconductor switching element S1 operates on/off with a midpoint voltage (an intermediate potential), which is generated at the connection point with the primary winding of the transformer T, as a reference potential. Consequently, the semiconductor switching element S1 only has to be driven on/off using the semiconductor device 1 according to the invention, in the same way as in the buck converter and boost-buck converter shown respectively in FIGS. 6A and 6B. Consequently, even in this case, it goes without saying that it is not necessary to provide the second driver 21 on the low side circuit 20 side.

Further, even when driving on/off the semiconductor switching element S1 in the kind of converter shown in each of FIGS. 6A to 6D, there is fear that a negative voltage is applied to the high side circuit 10 side when the semiconductor switching element S1 operates off. Consequently, according to the semiconductor device 1 including the current source 13 and negative voltage detection circuit 25 which function in the previously described way, as it is possible to simply and moreover quickly detect negative voltage generation, the semiconductor device 1 offers an immense practical advantage.

Figure 7A:
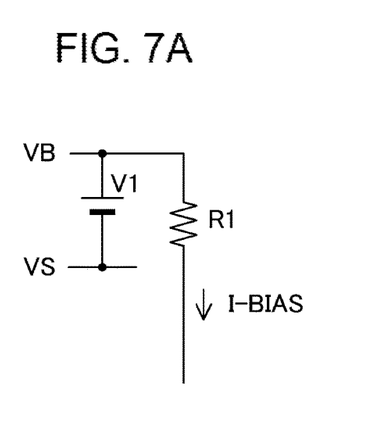
FIGS. 7A, 7B, and 7C are diagrams showing other configuration examples of the current source.

Also, it is also possible to configure the current source 13 in the ways shown in, for example, (a) to (c) of FIG. 7. Herein, the current source 13 shown in (a) of FIG. 7 is configured so as to cause a current to flow toward the low side circuit 20 via a resistance element R1 by connecting the resistance element R1 to a power source line through which to supply the power source voltage VB. According to the current source 13 configured in this way, it is not possible to supply a constant current toward the low side circuit 20 when in a steady state, but the size and direction of the current to be supplied to the low side circuit 20 change in accordance with the potential VB which changes in accordance with a change in the second potential VS. Consequently, even when the current source 13 is simply configured using only the resistance element R1, the same advantageous effects as in the previously described embodiment are produced.

Figure 7B:
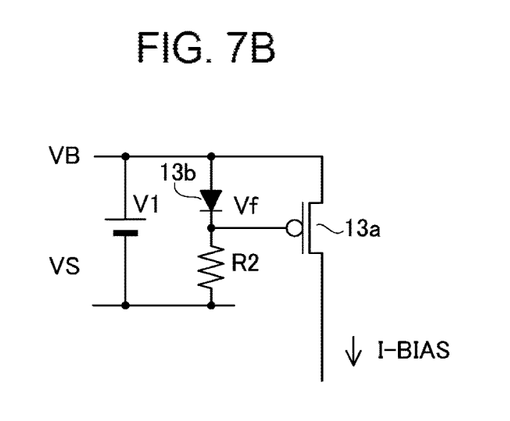

Also, the current source 13 shown in (b) of FIG. 7 is such that a voltage to be applied to the gate of the p-type MOS-FET 13a is stabilized using the diode 13b and a resistance element R2 connected in series to the diode 13b, thus making constant the current to be supplied to the low side circuit 20 via the p-type MOS-FET 13a. According to this circuit, as the gate-source voltage of the p-type MOS-FET 13a is made constant by a forward voltage Vf of the diode 13b, it is possible to supply a stable constant current.

Figure 7C:
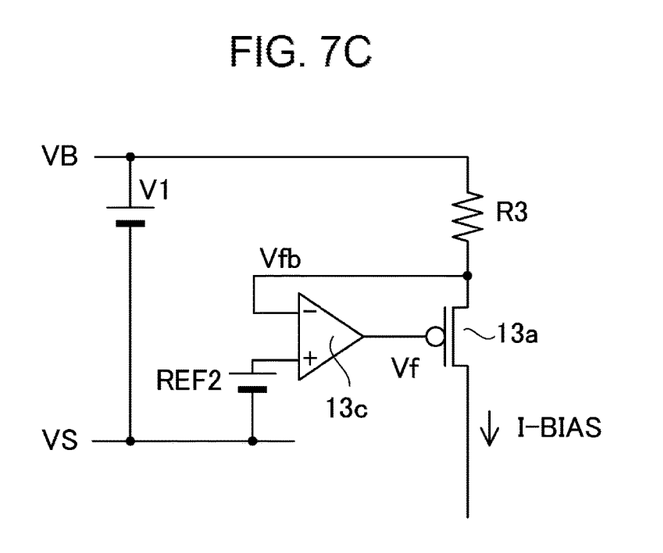

Furthermore, the current source 13 shown in (c) of FIG. 7 is configured by interposing a resistance element R3 in series between the source of the p-type MOS-FET 13a and the power source line through which to supply the power source voltage VB. Further, a voltage applied to the source of the p-type MOS-FET 13a and a predetermined reference voltage REF2 are connected respectively to the inverting input terminal and non-inverting input terminal of an operational amplifier 13c, and the output voltage of the operational amplifier 13c is applied to the gate of the p-type MOS-FET 13a, thereby making an arrangement such as to make constant the current to be supplied to the low side circuit 20 via the p-type MOS-FET 13a. That is, the current I-BIAS flowing through the resistance element R3 can be controlled to be {(VB−VS)−REF2}/R3 by a virtual short-circuit operation of the inverting input terminal and non-inverting input terminal of the operational amplifier 13c.

Even though the current source 13 is configured in this way, and the current to be supplied to the low side circuit 20 from the current source 13 is controlled so as to be made constant, the direction of the current flowing via the p-type MOS-FET 13a changes when a negative voltage is applied to the current source 13, meaning that the same advantageous effects as in the previously described embodiment are produced. That is, even though the configuration of the current source 13 is modified in the ways shown in, for example, (a) to (b) of FIG. 7 according to the specification of the semiconductor device 1, it becomes possible in the low side circuit 20 to simply and quickly detect a negative voltage applied to the high side circuit 10.

Also, the current source 13 can also be configured as in (c) of FIG. 7. In this case, in a normal state in which no negative voltage is applied, a current of {V1−Vfb (=the output voltage of the reference voltage REF2)}/R3 flows through the p-type MOS-FET 13a, and when a negative voltage is applied, the current flowing through the p-type MOS-FET 13a becomes zero (0). Also, although not particularly shown in the drawing, it is also useful that a backflow prevention diode is interposed in series at the current output terminal of the current source 13 configured in the heretofore described way. By providing this kind of backflow prevention diode, it is not possible to determine the direction of the current supplied from the current source 13, as previously described, but it is at least possible to turn the current itself to zero (0), when a negative voltage is applied to the high side circuit 10. Consequently, in these cases, by detecting whether or not the current supplied from the current source 13 becomes zero (0), it becomes possible to detect that a negative voltage is applied to the high side circuit 10.

The invention is not limited to the heretofore described embodiment. For example, the reference voltage REF which is of a negative voltage detection threshold value in the negative voltage detection circuit 25 only has to be determined in accordance with the size of the current I-BIAS or the configuration of the current-voltage conversion circuit 26. Also, the number of Zener diodes ZD used as the clamp circuit in the current-voltage conversion circuit 26 also only has to be fixed in accordance with the Zener voltage of the Zener diode ZD and a clamp voltage which should be set.

Also, in the embodiment, the arrangement has been such as to generate an anomaly signal when a negative voltage detection state continues for a predetermined time, but it is also possible to, for example, count the frequency of negative voltage generation and generate an anomaly signal when the generation frequency exceeds a threshold value. Also, an arrangement may be such as to fix the operation of protecting the semiconductor device 1 with the controller CONT in accordance with the relationship between the size of a negative voltage applied to the semiconductor device 1 and the time for which the negative voltage is generated.

Specifically, when a negative voltage of, for example, −100V is applied to the semiconductor device 1, the semiconductor device 1 breaks down more easily when the time for which the negative voltage is applied is 1 μs than when the time is 100 ns. That is, a condition for the semiconductor device 1 to break down due to the negative voltage depends on the relationship between the size of the negative voltage and the time for which the negative voltage is generated. Consequently, with the breakdown condition as a premise, it is only necessary to output the alarm signal ALM before the semiconductor device 1 breaks down, and cause the controller CONT to execute a control such as to stop the drive of the semiconductor device 1 or reduce the time for which the negative voltage continues.

Incidentally, the control to reduce the time for which the negative voltage continues is such that, for example, a current change di/dt when the first and second semiconductor switching elements UD1 and LD1 operate to switch only has to be changed by variably controlling the gate resistance values of the first and second semiconductor switching elements UD1 and LD1. In addition, the invention can be variously modified and implemented without departing from the scope of the invention.

REFERENCE SIGNS LIST

UD1 FIRST SEMICONDUCTOR SWITCHING ELEMENT
LD1 SECOND SEMICONDUCTOR SWITCHING ELEMENT
HVIC HIGH VOLTAGE INTEGRATED CIRCUIT
CONT CONTROLLER
1 SEMICONDUCTOR DEVICE
10 HIGH SIDE CIRCUIT
11 FIRST DRIVER
12 FIRST CONTROL CIRCUIT
13 CURRENT SOURCE
20 LOW SIDE CIRCUIT
21 SECOND DRIVER
22 SECOND CONTROL CIRCUIT
23 PULSE GENERATION CIRCUIT
24 ALARM OUTPUT CIRCUIT
25 NEGATIVE VOLTAGE DETECTION CIRCUIT
26 CURRENT-VOLTAGE CONVERSION CIRCUIT
41 CURRENT MIRROR CIRCUIT
51 NORMAL OPERATION
52 IDLE
53 ANOMALY ALARM
55 NEGATIVE VOLTAGE DETECTION ALARM
A ANOMALY TREATMENT
B ANOMALY TREATMENT

The invention claimed is:

1. A semiconductor device, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein the current source is configured to supply a predetermined current toward the second circuit when the first voltage is higher than the second voltage, and configured to reverse a direction of the current to be supplied to the second circuit when the first voltage is lower than the second voltage.

2. A semiconductor device according to claim 1, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein
the negative voltage detection circuit, when the direction of the current supplied from the current source changes, detects the change as the negative voltage being applied to the first circuit.

3. A semiconductor device, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein
the first circuit is a high side circuit which controls an on/off operation of a semiconductor switching element with a higher voltage than a ground potential received at a first terminal of the semiconductor switching element, and which has an intermediate potential as the reference potential, the intermediate potential being the potential of a second terminal of the semiconductor switching element, while the second circuit is a low side circuit which operates with the ground potential as the reference voltage.

4. The semiconductor device according to claim 3, wherein the first circuit is configured to drive a high side driver which controls an operation of the semiconductor switching element which operates on/off with the intermediate potential as a reference.

5. The semiconductor device according to claim 4, wherein the high side driver is part of the first circuit.

6. The semiconductor device according to claim 1, wherein the first circuit turns on/off a current flowing through a inductor via a semiconductor switching element and controls an on/off operation of the semiconductor switching element in a converter which generates power to be supplied to a load via the inductor.

7. A semiconductor device, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein
the first and second circuits are integrated into a high voltage compatible integrated circuit which complementarily controls an on/off drive of first and second semiconductor switching elements which are connected in series to form a half bridge circuit and make up a power source portion which supplies power to a load from a midpoint of the half bridge circuit, the potential of the midpoint being the reference potential.

8. The semiconductor device according to claim 7, wherein the first circuit is configured to drive a high side driver which controls the operation of the first switching element which operates on/off with an intermediate potential as the reference potential, the intermediate potential being the potential of the midpoint of the half bridge circuit, and
wherein the second circuit drives a low side driver which controls the operation of the second semiconductor switching element which operates on/off with the reference voltage as a reference.

9. The semiconductor device according to claim 8, wherein the high side driver is part of the first circuit.

10. The semiconductor device according to claim 1, wherein the current source includes a high voltage MOS-FET including a source terminal connected to a predetermined voltage power source, the high voltage MOS-FET configured to operate based on receiving a predetermined bias voltage at the gate and configured to output a constant current from a drain terminal.

11. A semiconductor device, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein
the negative voltage detection circuit includes a current-voltage conversion circuit configured to convert the current supplied from the current source to an output voltage and a comparator which compares the output voltage of the current-voltage conversion circuit with a predetermined reference voltage and detects a negative voltage applied to the first circuit.

12. The semiconductor device according to claim 11, wherein the current-voltage conversion circuit includes a resistance element configured to convert the current supplied from the current source to the output voltage and a clamp circuit connected in parallel to the resistance element and configured to clamp a voltage applied to the resistance element.

13. The semiconductor device according to claim 12, wherein the clamp circuit includes a Zener diode.

14. The semiconductor device according to claim 12, wherein the clamp circuit includes a plurality of Zener diodes connected in series and a diode connected in inverse parallel to the series circuit of the Zener diodes.

15. The semiconductor device according to claim 11, wherein the current-voltage conversion circuit includes a current mirror circuit configured to generate a current proportional to the current supplied from the current source, a resistance element configured to convert a current output from the current mirror circuit to an output voltage, and a clamp circuit connected in parallel to the current mirror circuit and configured to clamp a voltage applied to the current mirror circuit.

16. The semiconductor device according to claim 15, wherein the clamp circuit includes a Zener diode.

17. The semiconductor device according to claim 15, wherein the clamp circuit includes a plurality of Zener diodes connected in series and a diode connected in inverse parallel to the series circuit of the Zener diodes.

18. The semiconductor device according to claim 1, wherein the negative voltage detection circuit is configured to output, based on detecting a negative voltage applied to the first circuit, a stop signal which stops the drive of a semiconductor switching element which is turned on and off by the first circuit.

19. A semiconductor device, comprising:
a first circuit configured to operate with a first voltage as a reference potential;
a second circuit configured to operate with a second voltage different from the first voltage as a reference voltage;
a current source in the first circuit configured to supply a current to the second circuit and to change the current based on whether the first voltage becomes a negative voltage with respect to the second voltage; and
a negative voltage detection circuit in the second circuit and configured to monitor a change in the current supplied from the current source and configured to detect that the negative voltage is applied to the first circuit, wherein
the second circuit includes an alarm circuit configured to output, based on a signal being output from the negative voltage detection circuit for a predetermined time, an alarm signal indicating an anomaly of a semiconductor having a driver controlled by the first circuit.

* * * * *